(12) United States Patent
Marmaropoulos et al.

(10) Patent No.: US 7,388,166 B2
(45) Date of Patent: Jun. 17, 2008

(54) STRETCHABLE FABRIC SWITCH

(75) Inventors: George Marmaropoulos, Yorktown Heights, NY (US); Giang Truong Vu, New York, NY (US); Katharine Pulford, Hackney (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/560,483

(22) PCT Filed: Jun. 23, 2004

(86) PCT No.: PCT/IB2004/050983

§ 371 (c)(1),
(2), (4) Date: Dec. 12, 2005

(87) PCT Pub. No.: WO2004/114339

PCT Pub. Date: Dec. 29, 2004

(65) Prior Publication Data

US 2006/0175187 A1    Aug. 10, 2006

Related U.S. Application Data

(60) Provisional application No. 60/482,101, filed on Jun. 24, 2003.

(51) Int. Cl.
*H01H 7/00* (2006.01)

(52) U.S. Cl. .................. 200/52 R; 200/85 R; 200/86 R
(58) Field of Classification Search .. 200/61.13–61.19, 200/61.41–61.44, 52 R, 85 A, 85 R, 86 A, 200/86 R, 511–514
See application file for complete search history.

(56) References Cited

U.S. PATENT DOCUMENTS

| | | | | | |
|---|---|---|---|---|---|
| 4,606,968 | A | * | 8/1986 | Thornton et al. | 442/187 |
| 5,047,602 | A | * | 9/1991 | Lipka | 200/86 R |
| 5,801,914 | A | * | 9/1998 | Thrash | 361/104 |
| 6,166,338 | A | * | 12/2000 | Ebato | 200/61.43 |
| 6,352,149 | B1 | * | 3/2002 | Gartland | 198/810.02 |
| 6,642,467 | B2 | * | 11/2003 | Farringdon | 200/511 |
| 6,796,578 | B2 | * | 9/2004 | White et al. | 280/735 |
| 7,098,444 | B2 | * | 8/2006 | Beinhocker | 250/227.14 |

* cited by examiner

*Primary Examiner*—Elvin Enad
*Assistant Examiner*—M. Fishman

(57) ABSTRACT

The present invention provides a stretchable fabric that may serve as a switch device or coupling to an electronic device and a power source by merely stretching or pushing the fabric. The stretchable fabrics may be usable in a wearable garment, furniture, or other suitable locations where it can be incorporated to close a circuit. Through a releasable stretching or pushing action by the user, electrically conductive strips integrated in the fabrics come in contact to activate related ancillary equipment such as power supplies or electronic devices.

10 Claims, 2 Drawing Sheets

STRETCHABLE FABRIC SWITCH

CROSS REFERENCE TO RELATED APPLICATION

This application claims the benefit of U.S. provisional application Ser. No. 60/482,101 filed Jun. 24, 2003, which is incorporated herein by reference.

TECHNICAL FIELD

The present invention relates to a fabric switch system intended to permit the connection of an electronic device or power source. More specifically, the present invention relates to a stretchable fabric switch system that may be incorporated into a garment, furniture, or in a location most conveniently accessible to the user to serve as a coupling of electrical signals or power.

TECHNICAL BACKGROUND

Intuitive switches that utilize soft fabric materials are conductive fibers and are highly desirable in wearable or other electronics applications. Techniques known for providing an electrical switch system in clothing fabric typically include adding electric wires and control devices that are standard "off the shelf" electronic components to the fabric, by incorporating the wires directly into the fabric or by attaching the wires to the fabric, e.g., by sewing.

SUMMARY OF PRESENT DISCLOSURE

The present invention relates to a stretchable switch system that can be realized in a simple, intuitive, and reliable implementation. In particular, the present invention facilitates manufacture of such switch systems as close as possible to the manufacturing techniques used in the garment industry for widespread acceptance within the garment manufacturing industry.

The present invention discloses stretchable electro-conductive fabrics, which include an inner cord comprising at least two conductive cords releasably connected in series and a non-conductive cord enclosing the inner cord. The non-conductive cord is stretchable when pulled to release the contact between the two conductive cords that are in contact electrically, thus opening a circuit. This "pull to break" action can operate a simple electronic functionality and can be manufactured using conventional textile manufacturing processes. In the embodiment, both ends of the inner cord may be coupled to a fabric circuit integrated in a garment or furniture, or they can serve as a coupling to an electronic device or a power source.

According to one aspect of the invention, a garment or furniture of desired form and function can be constructed in a conventional manner using readily available fabrics and materials, and the stretchable electro-conductive fabrics serving as a switch system can be positioned advantageously within a wearable garment or furniture that permits easy manual activation by a person. This type of switch could have application on surfaces that can have switching created by stretching of the fabrics, i.e., clothing, seating, and fabric products.

According to another aspect of the invention, a fabric switch including a matrix of woven fibers that are non-conductive and a pair of conductive fibers interwoven in the woven fibers are provided to form an electrical circuit. In operation, the conductive fibers come in contact electrically when said woven fibers are in a relaxed mode but come apart in a stretch mode.

DETAILED DESCRIPTION

In the following description, for purposes of explanation rather than limitation, specific details are set forth such as the particular architecture, interfaces, techniques, etc., in order to provide a thorough understanding of the present invention. For purposes of simplicity and clarity, detailed descriptions of well-known devices, circuits, and methods are omitted so as not to obscure the description of the present invention with unnecessary detail.

Figure 1A:
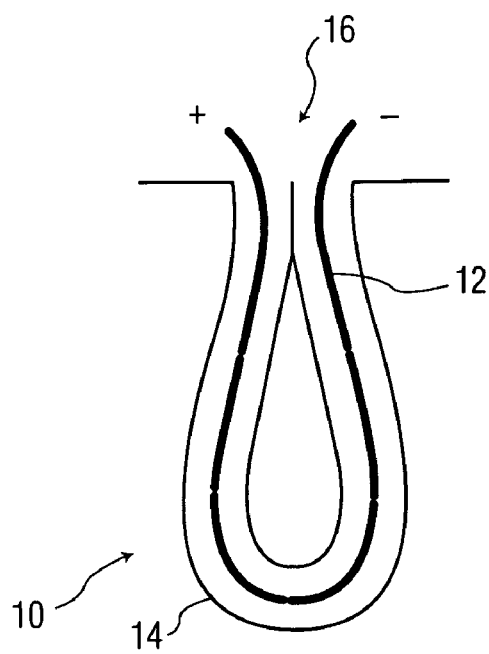
FIG. 1a illustrates a first embodiment of a stretchable fabric switch system in accordance with this invention.

Referring to FIG. 1a, a fabric system 10 according to an embodiment of the present invention includes a conductive inner cord 12 surrounded by a stretchable hollow cord 14.

The conductive inner cord 12 running through the stretchable hollow cord 14 is broken in different lengths and releasably connected together in series depending on the mode of operation. In particular, the conductive inner cord 12 is woven of a conductive non-stretch yard, which is separated in at least one place when pulled. The hollow cord 14 may be made water-resistant or water-proof in the area surrounding the conductive inner cord 12 to provide additional protection.

The material of the stretchable hollow cord 14 may be either natural or synthetic, and the fabric created from such materials can be either woven or sheet-formed in any well-known manner. Alternatively, the stretchable hollow cord 14 may be constructed from non-woven (felted) or knitted fabrics or a composite structure. However, in each alternative case, an electrically conductive inner cord 12 is included in the production of the fabric, thus providing electrically conductive capabilities.

In the embodiment illustrated in FIG. 1a, the cords 12 and 14 may be incorporated in a garment 16, such as a conventional sleeveless top shirt or a short or long-sleeved vest or jacket, or furniture to serve as a coupling of electrical signals or power. In addition, the conductive cord 12 may be coupled to a power source, an output device, fabric-mounted circuit, etc., in the form of loops to receive or otherwise engage equipment considered ancillary to the fabric switch 10, such as an external heart-monitoring device, external defibrillator, cell phone, radio, pager, GPS device, personal communication assistant, or other signal transmitter or duplex interactive system. Alternatively, such ancillary equipment or other electronic devices may be integrated in the garment or furniture and used in conjunction with the fabric switch system 10 for transmitting the desired signals or power in any well-known manner.

Figure 1B:
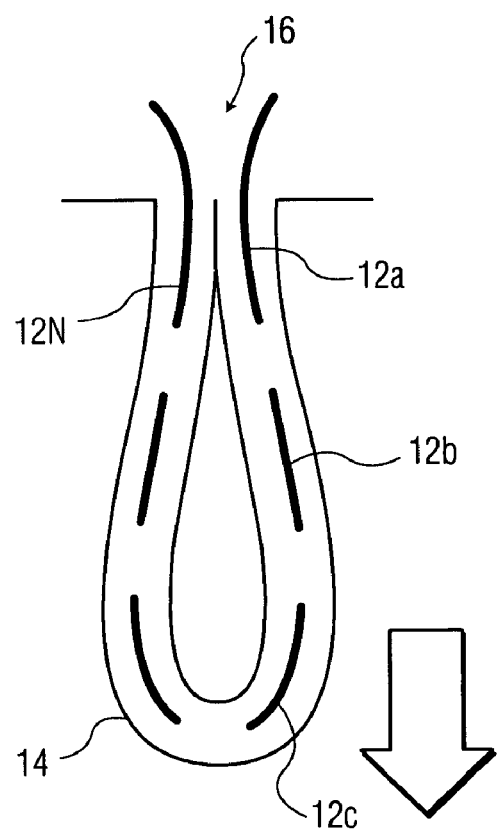
FIG. 1b illustrates the switch system of FIG. 1a when stretched in accordance with a first embodiment of this invention.

Referring to FIG. 1a, when the cords 12 and 14 are in their relaxed mode, the segmented pieces of the conductive inner cords 12a-12n are in contact physically and electrically with each other in series, thus closing a circuit. Referring to FIG. 1b, when the cord 14 is stretched, as indicated by arrow, the different pieces of the inner conductive cord 12 separate and therefore break the circuit. The circuit returns to close when the force is released. Therefore, a user can readily engage the opening and closing of a circuit by merely pulling the cord 14.

Figure 2A:
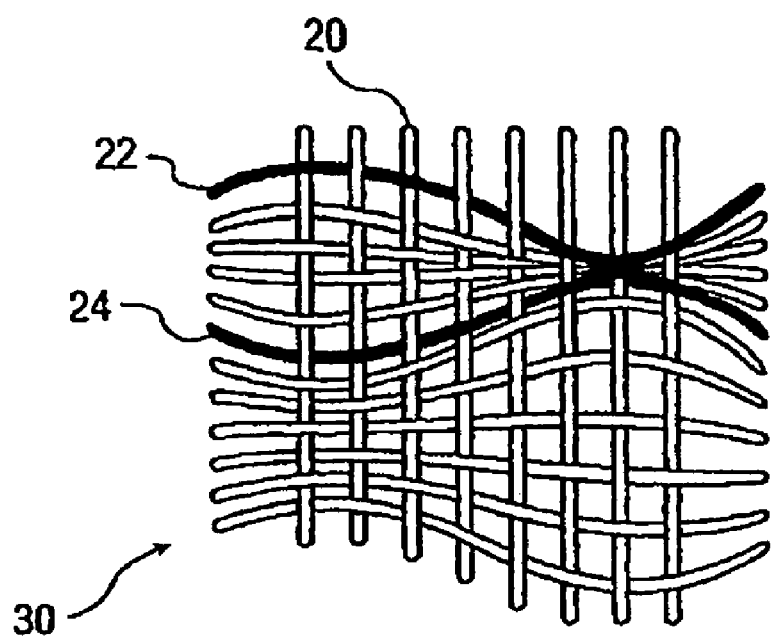
FIG. 2a illustrates a second embodiment of a stretchable fabric switch system in accordance with this invention.

Referring to FIG. 2a, a fabric switch system 30 according to another embodiment of the present invention includes a matrix of a non-conductive knit structure 20 and a pair of conductive threads or fibers 22 and 24 interwoven in the knit structure 20 and come in contact electrically with each another during a relaxed state. The conductive fibers 22 and 24 serve as electrical conduits capable of carrying data signals and/or power in any known manner, and may be connected to electrical devices soldered directly onto the fabric. Alternatively, the conductive fibers 22 and 24 may be connected to a fabric-mounted circuit or electrical components in the form of loops to receive or otherwise engage equipment considered ancillary to the fabric switch 10, such as an external heart-monitoring device, external defibrillator, cell phone, radio, pager, GPS device, personal communication assistant, or other signal transmitter or duplex interactive system.

Figure 2B:
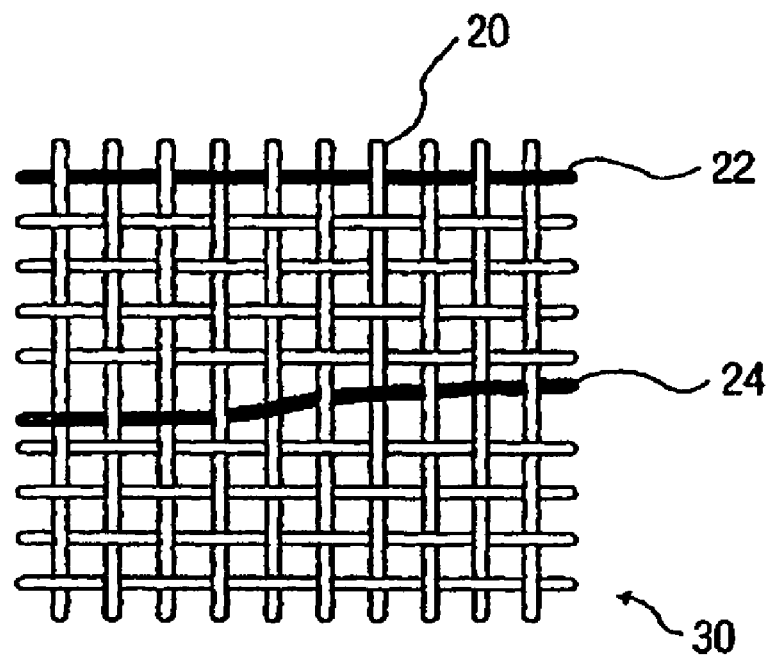
FIG. 2b illustrates the switch system of FIG. 2a when stretched in accordance with a second embodiment of this invention.

Referring to FIG. 2a, in a relaxed state, the conductive fibers 22 and 24 make contact with each other physically and electrically, thus closing a circuit. Referring to FIG. 2b, when the fabric structure 20 is stretched or pushed, the conductive connections between the conductive fibers 22 and 24 split from each other, and hence the circuit is open. Accordingly, a user can readily engage the opening and closing of a circuit defined by the two conductive fibers 22 and 24 or an ancillary device by merely stretching or pushing the fabric layers.

While the preferred embodiments of the present invention have been illustrated and described, it will be understood by those skilled in the art that various changes and modifications can be made, and equivalents may be substituted for elements thereof without departing from the true scope of the present invention. Thus, the shape of an interconnect system in the drawings should not impose limitations on the scope of the invention. Therefore, it is intended that the present invention not be limited to the particular embodiment disclosed as the best mode contemplated for carrying out the present invention, but that the present invention include all embodiments falling within the scope of the appended claims.

The invention claimed is:

1. A fabric switch comprising:
   an inner cord including at least two conductive cords releasably connected in linear series; and
   a non-conductive cord enclosing said inner cord,
   wherein said non-conductive cord is stretchable to release the contact between said at least two conductive cord electrically, and
   wherein said non-conductive cord is resilient to enable the contact between said at least two conductive cords to be resumed electrically.

2. The switch of claim 1, wherein the material of said non-conductive cord defines a moisture-resistant enclosure for said inner cord.

3. The switch of claim 1, wherein said inner cord and said non-conductive cord are shaped in a loop form.

4. The switch of claim 1, wherein said inner cord is coupled to a fabric circuit integrated in a garment.

5. The switch of claim 1, wherein said inner cord serves as a coupling to an electronic device.

6. The switch of claim 1, wherein said inner cord serves as a coupling to a power source.

7. The switch of claim 1, wherein said inner cord engages and supports ancillary units to transmit electronic signals.

8. The switch of claim 1, wherein said inner cord is coupled to a fabric circuit integrated in furniture.

9. A method for permitting a person to activate a fabric switch, said method comprising the steps of:
   providing an inner cord including at least two conductive cords releasably connected in linear series and a non-conductive cord enclosing said inner cord;
   mounting both said inner cord and said non-conductive cords to a garment or furniture;
   stretching said non-conductive cord to release the contact between said at least two conductive cords,
   releasing said non-conductive cord to enable contact between said at least two conductive cords to be resumed electrically.

10. The method of claim 9, further comprising the step of protecting said inner cord from ambient conditions by enclosing it in said nonconductive cord having a moisture-resistant material.

* * * * *